(12) United States Patent
Hong et al.

(10) Patent No.: US 11,508,747 B2
(45) Date of Patent: Nov. 22, 2022

(54) SEMICONDUCTOR MEMORY DEVICE

(71) Applicant: SK hynix Inc., Icheon-si (KR)

(72) Inventors: Young Ock Hong, Icheon-si (KR); Eun Seok Choi, Seongnam-si (KR)

(73) Assignee: SK hynix Inc., Icheon-si (KR)

( * ) Notice: Subject to any disclaimer, the term of this patent is extended or adjusted under 35 U.S.C. 154(b) by 276 days.

(21) Appl. No.: 16/868,300

(22) Filed: May 6, 2020

(65) Prior Publication Data

US 2021/0159245 A1 May 27, 2021

(30) Foreign Application Priority Data

Nov. 21, 2019 (KR) .................. 10-2019-0150725

(51) Int. Cl.
| | |
|---|---|
| *H01L 27/11582* | (2017.01) |
| *H01L 27/11519* | (2017.01) |
| *G11C 7/18* | (2006.01) |
| *H01L 27/1157* | (2017.01) |
| *H01L 27/11524* | (2017.01) |
| *H01L 27/11565* | (2017.01) |
| *H01L 27/11556* | (2017.01) |

(52) U.S. Cl.
CPC ......... *H01L 27/11582* (2013.01); *G11C 7/18* (2013.01); *H01L 27/1157* (2013.01); *H01L 27/11519* (2013.01); *H01L 27/11524* (2013.01); *H01L 27/11556* (2013.01); *H01L 27/11565* (2013.01)

(58) Field of Classification Search
CPC ......... H01L 27/11582; H01L 27/11519; H01L 27/11524; H01L 27/11556; H01L 27/11565; H01L 27/1157; H01L 27/11568; H01L 27/11575; H01L 27/11573; H01L 29/66833; H01L 29/792; G11C 7/18
See application file for complete search history.

(56) References Cited

U.S. PATENT DOCUMENTS

| | | | | |
|---|---|---|---|---|
| 9,219,073 | B2 * | 12/2015 | Chen | ............... H01L 27/1157 |
| 9,865,615 | B2 * | 1/2018 | Lee | ............... H01L 23/528 |
| 2020/0266207 | A1 * | 8/2020 | Liu | ............... H01L 29/4234 |

FOREIGN PATENT DOCUMENTS

| | | |
|---|---|---|
| KR | 1020170083340 A | 7/2017 |
| KR | 1020190010403 A | 1/2019 |

* cited by examiner

*Primary Examiner* — Allison Bernstein
(74) *Attorney, Agent, or Firm* — William Park & Associates Ltd.

(57) ABSTRACT

A semiconductor memory device includes: a stacked structure including first and second select patterns spaced apart from each other in a first direction; a gate isolation layer extending in a second direction intersecting the first direction between the first and second select patterns; channel structures penetrating the stack structure; and first and second bit lines extending in the first direction, the first and second bit lines being adjacent to each other. The channel structures include: a first channel structure which penetrates the first select pattern and is spaced apart by a first distance from the gate isolation layer in the first direction; and a second channel structure which penetrates the second select pattern and is spaced apart by substantially the first distance from the gate isolation layer in the first direction. The first and second channel structures are respectively connected to the second and first bit lines.

19 Claims, 13 Drawing Sheets

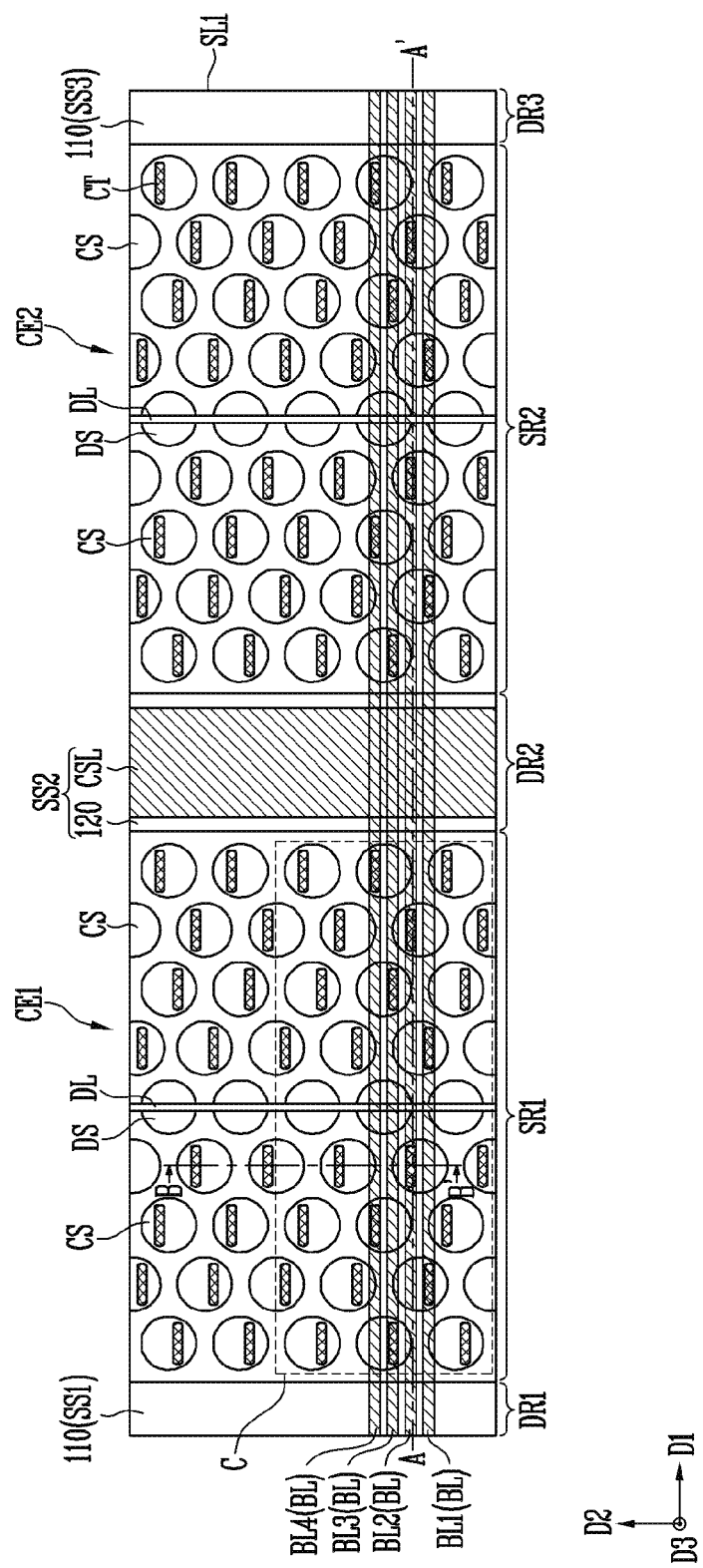

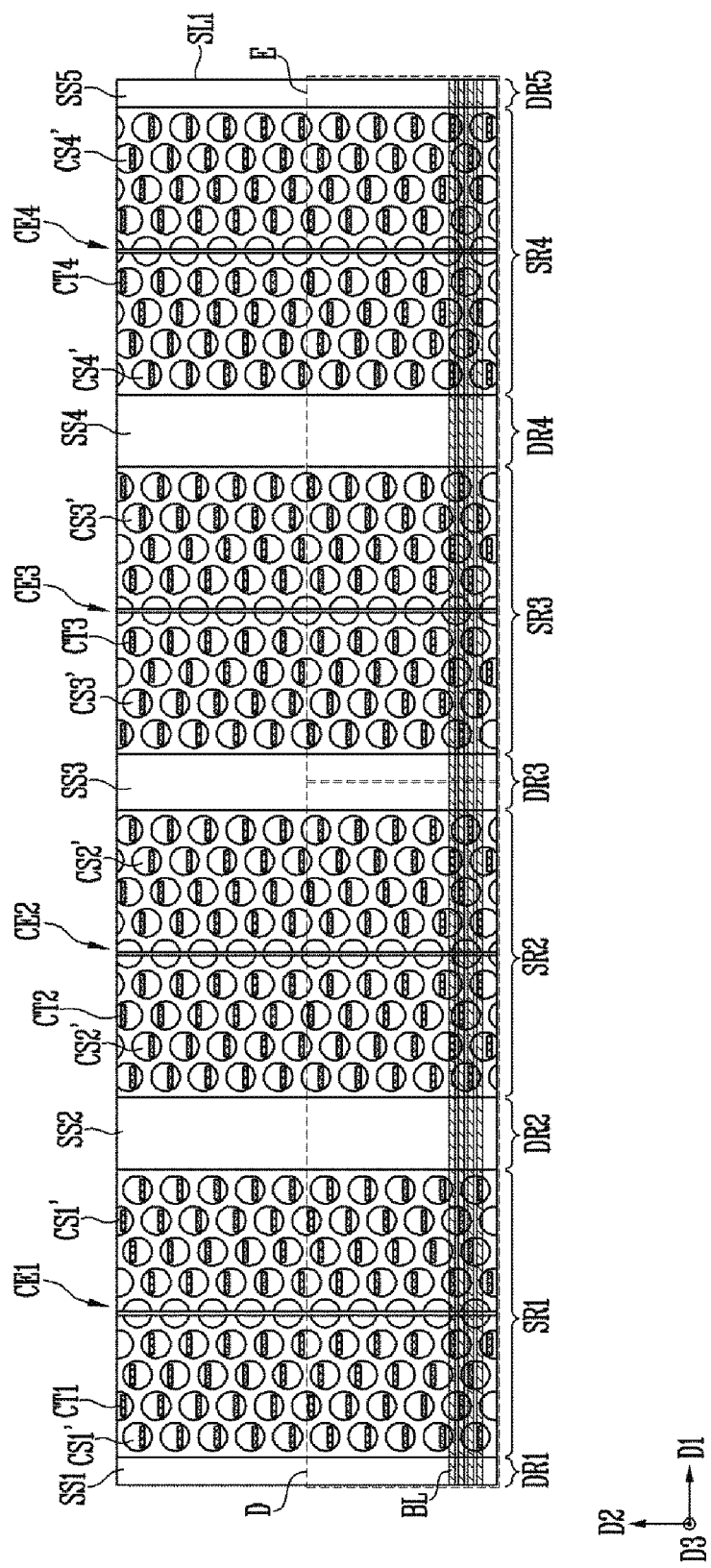

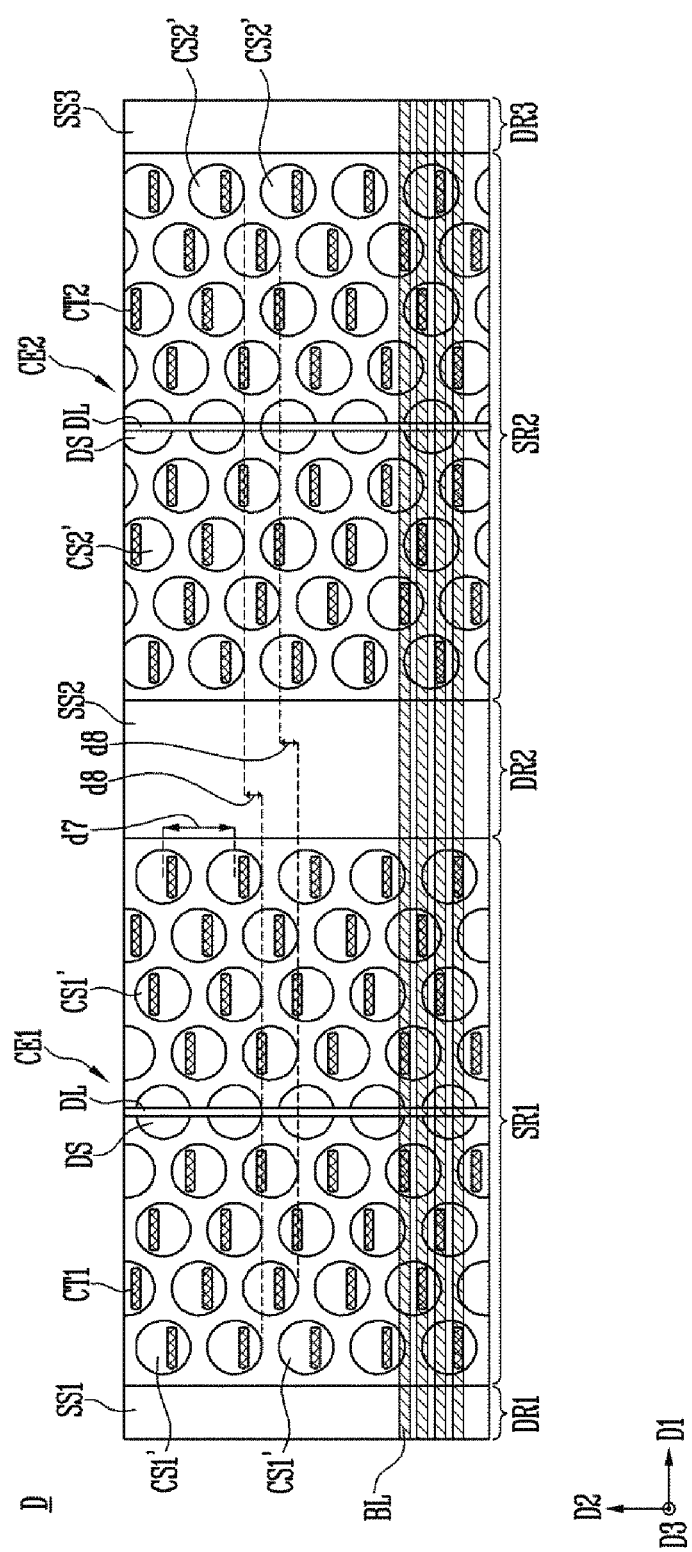

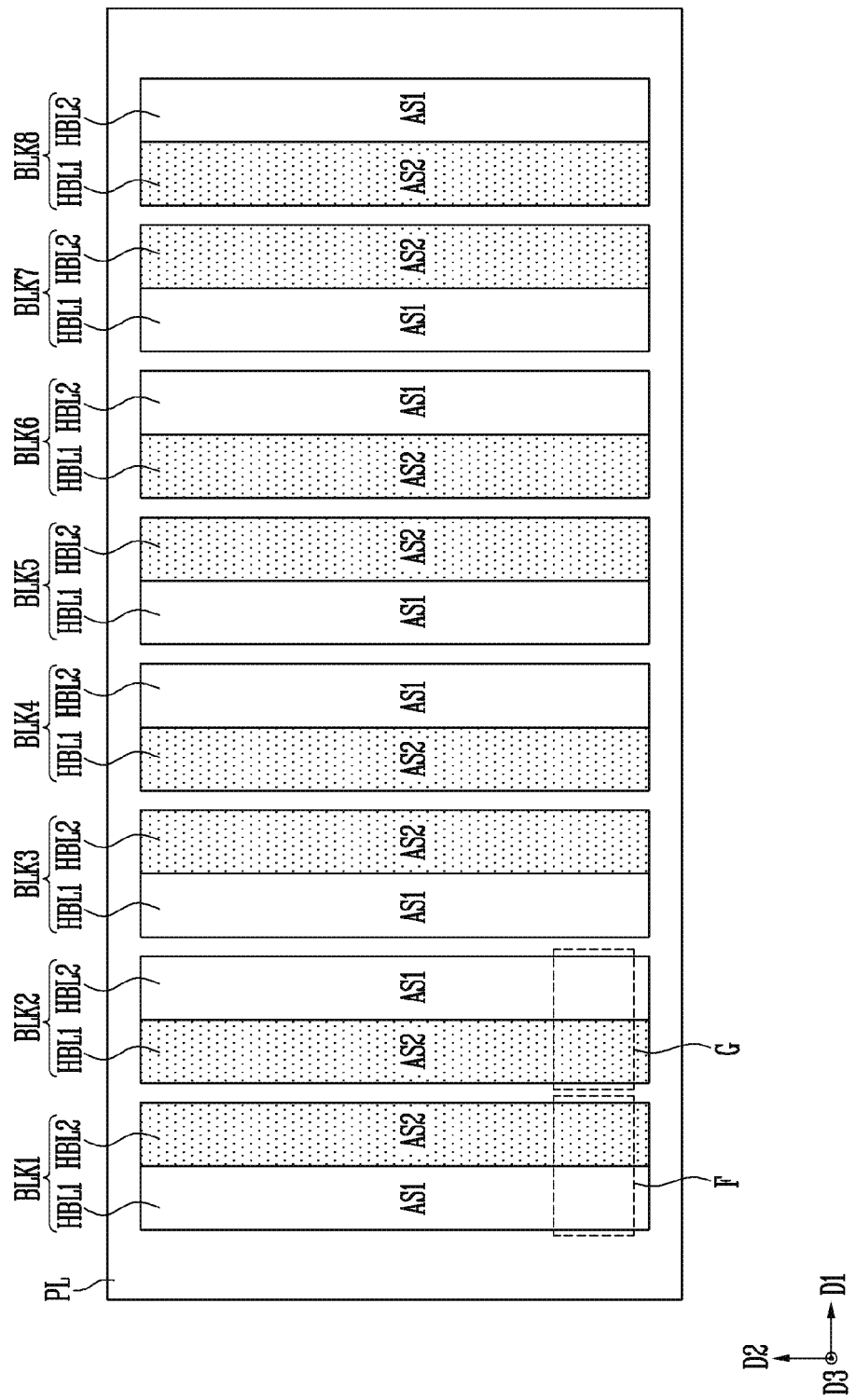

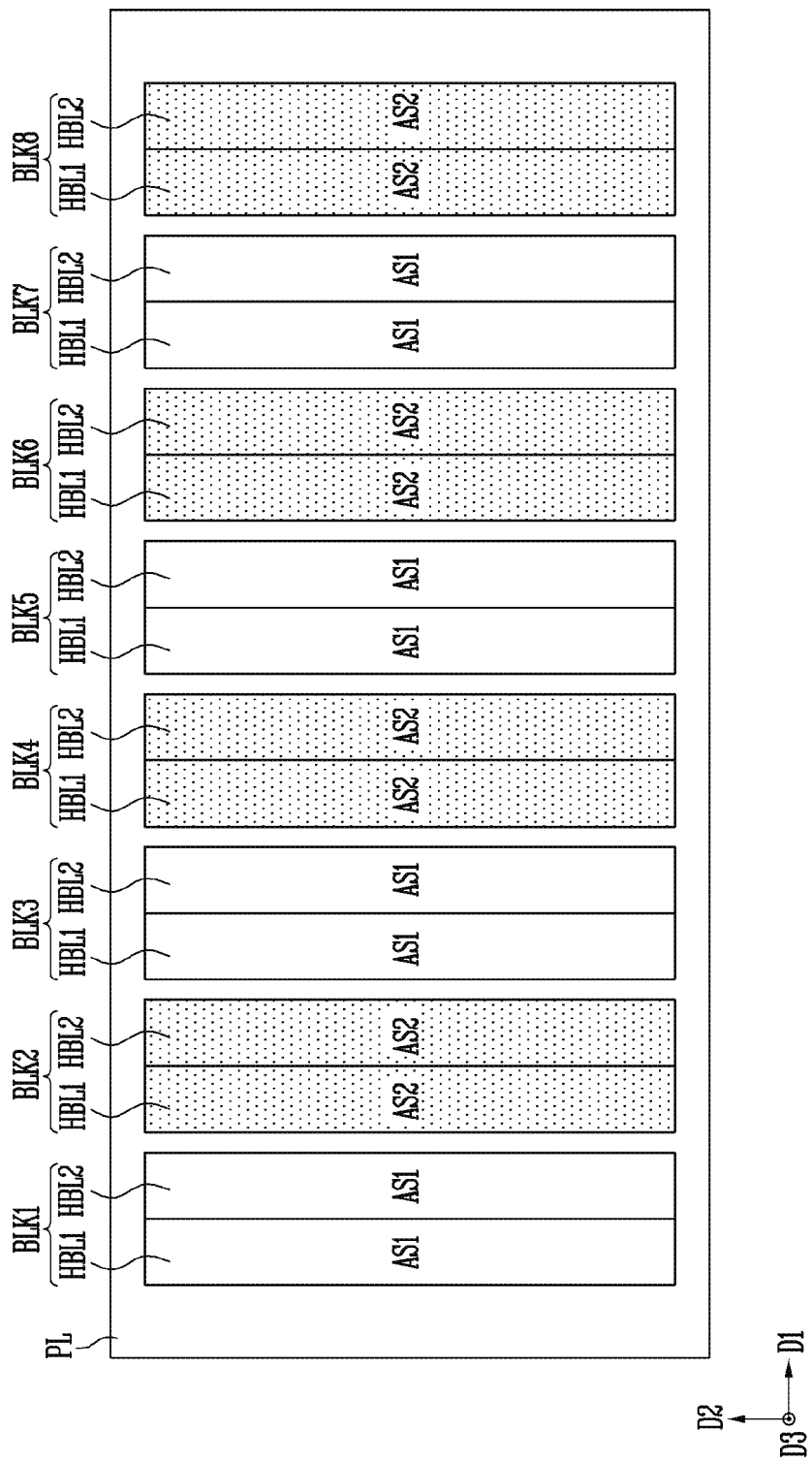

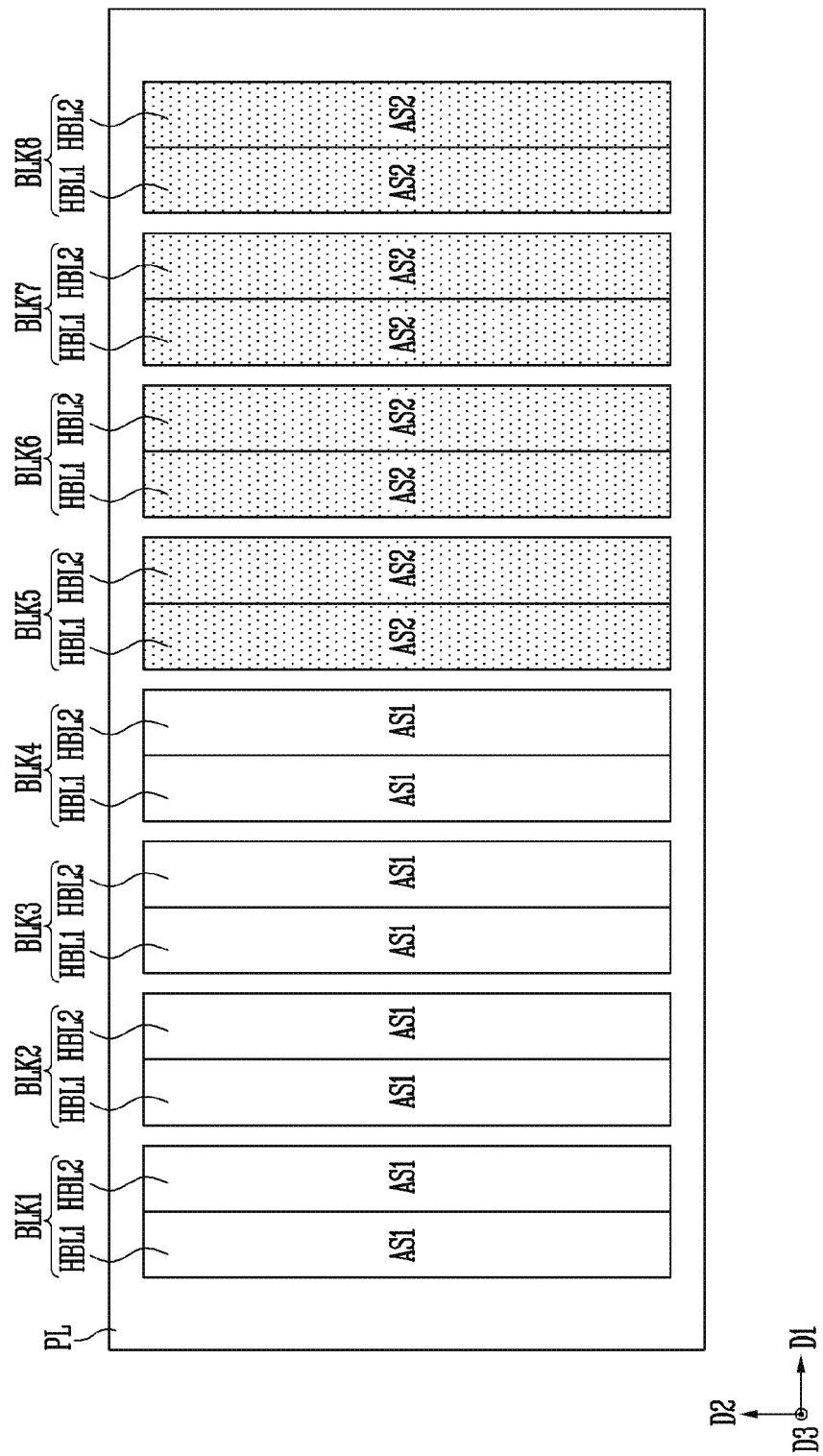

SEMICONDUCTOR MEMORY DEVICE

CROSS-REFERENCE TO RELATED APPLICATION

The present application claims priority under 35 U.S.C. § 119(a) to Korean patent application number 10-2019-0150725 filed on Nov. 21, 2019, in the Korean Intellectual Property Office, the entire disclosure of which is incorporated herein by reference.

BACKGROUND

1. Technical Field

The present disclosure generally relates to a semiconductor memory device, and more particularly, to a three-dimensional semiconductor memory device.

2. Related Art

A semiconductor memory device includes memory cells capable of storing data.

According to a method of storing data and a method of retaining data, the semiconductor memory device may be classified into a volatile semiconductor memory device and a nonvolatile semiconductor memory device. The volatile semiconductor memory device is a memory device in which stored data disappears when the supply of power is interrupted, and the nonvolatile semiconductor memory device is a memory device in which stored data is retained even when the supply of power is interrupted.

Recently, as portable electronic devices are increasingly used, nonvolatile semiconductor memory devices have been increasingly used, and the high integration and large capacity of semiconductor memory devices have been required to achieve portability and large capacity. In order to achieve the portability and large capacity, there have been proposed three-dimensional semiconductor memory devices.

SUMMARY

In accordance with an aspect of the present disclosure, there is provided a semiconductor memory device including: a stacked structure including a first select pattern and a second select pattern, which are spaced apart from each other in a first direction; a gate isolation layer extending in a second direction intersecting the first direction between the first select pattern and the second select pattern; channel structures penetrating the stack structure; and first and second bit lines extending in the first direction, the first and second bit lines being adjacent to each other, wherein the channel structures include: a first channel structure penetrating the first select pattern, the first channel structure being spaced apart by a first distance from the gate isolation layer in the first direction; and a second channel structure penetrating the second select pattern, the second channel structure being spaced apart by substantially the first distance from the gate isolation layer in the first direction, wherein the first channel structure is connected to the second bit line, and the second channel structure is connected to the first bit line, wherein each of the first and second bit lines overlaps with the first and second channel structures.

In accordance with another aspect of the present disclosure, there is provided a semiconductor memory device including: first and second stack structures including insulating patterns and conductive patterns; a first slit structure provided between the first and second stack structures to allow the first and second stack structures to be spaced apart from each other, the first slit structure extending in a first direction; first channel structures penetrating the first stack structure; and second channel structures penetrating the second stack structure, wherein a pitch in the first direction between the first channel structures is defined as a first distance, wherein the second channel structures are shifted by a second distance from the first channel structures in the first direction, wherein the second distance is smaller than the first distance.

In accordance with still another aspect of the present disclosure, there is provided a semiconductor memory device including: first and second stack structures including insulating patterns and the conductive patterns; a slit structure provided between the first and second stack structures to allow the first and second stack structures to be spaced apart from each other; first channel structures penetrating the first stack structure; second channel structures penetrating the second stack structure, the second channel structures being disposed substantially symmetrically to the first channel structures with respect to the slit structure; first contacts connected to the first channel structures; second contacts connected to the second channel structures, which are disposed asymmetrically from the first contacts with respect to the slit structure; and bit lines connected to the first contacts and the second contacts.

BRIEF DESCRIPTION OF THE DRAWINGS

Examples of embodiments will now be described hereinafter with reference to the accompanying drawings; however, they may be embodied in different forms and should not be construed as limited to the embodiments set forth herein. Rather, these embodiments are provided so that this disclosure will be thorough and complete, and will convey the scope of the examples to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 1A is a plan view of a semiconductor memory device in accordance with an embodiment of the present disclosure.

FIG. 2A is a plan view of a semiconductor memory device in accordance with an embodiment of the present disclosure.

FIG. 2B is an enlarged view of region D shown in FIG. 2A.

FIG. 3A is a schematic plan view of a semiconductor memory device in accordance with an embodiment of the present disclosure.

FIG. 4 is a schematic plan view of a semiconductor memory device in accordance with an embodiment of the present disclosure.

FIG. 5 is a schematic plan view of a semiconductor memory device in accordance with an embodiment of the present disclosure.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Embodiments provide a semiconductor memory device capable of improving operational reliability.

Figure 1B:
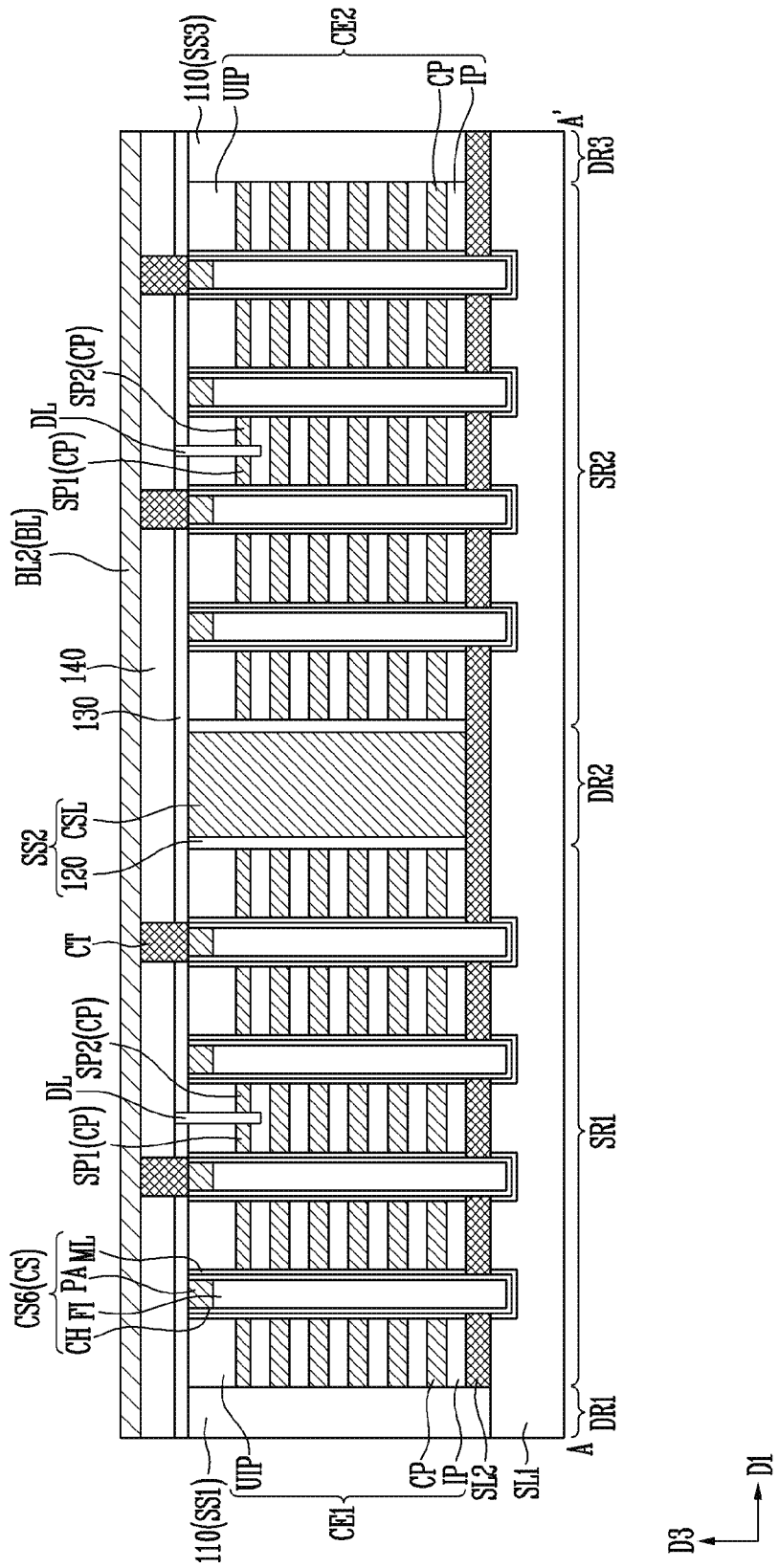
FIG. 1B is a sectional view taken along line A-A' shown in FIG. 1A.
Figure 1C:
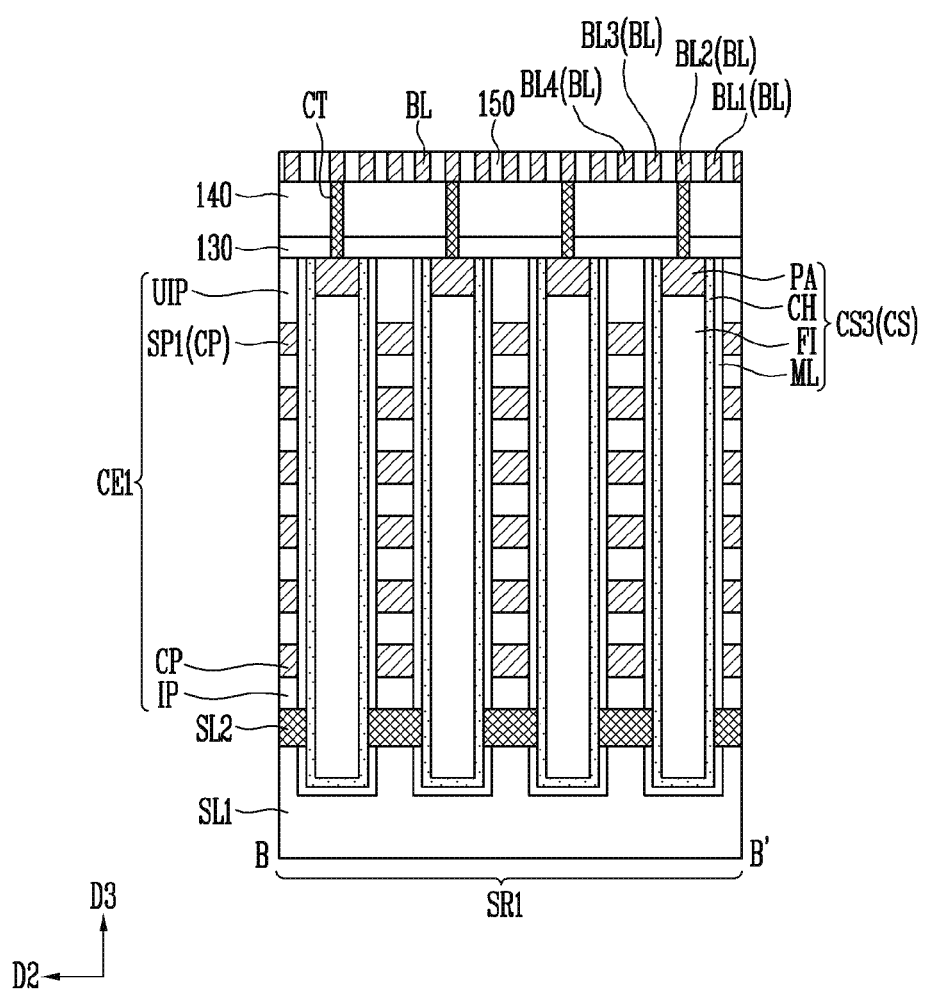
FIG. 1C is a sectional view taken along line B-B' shown in FIG. 1A.
Figure 1D:
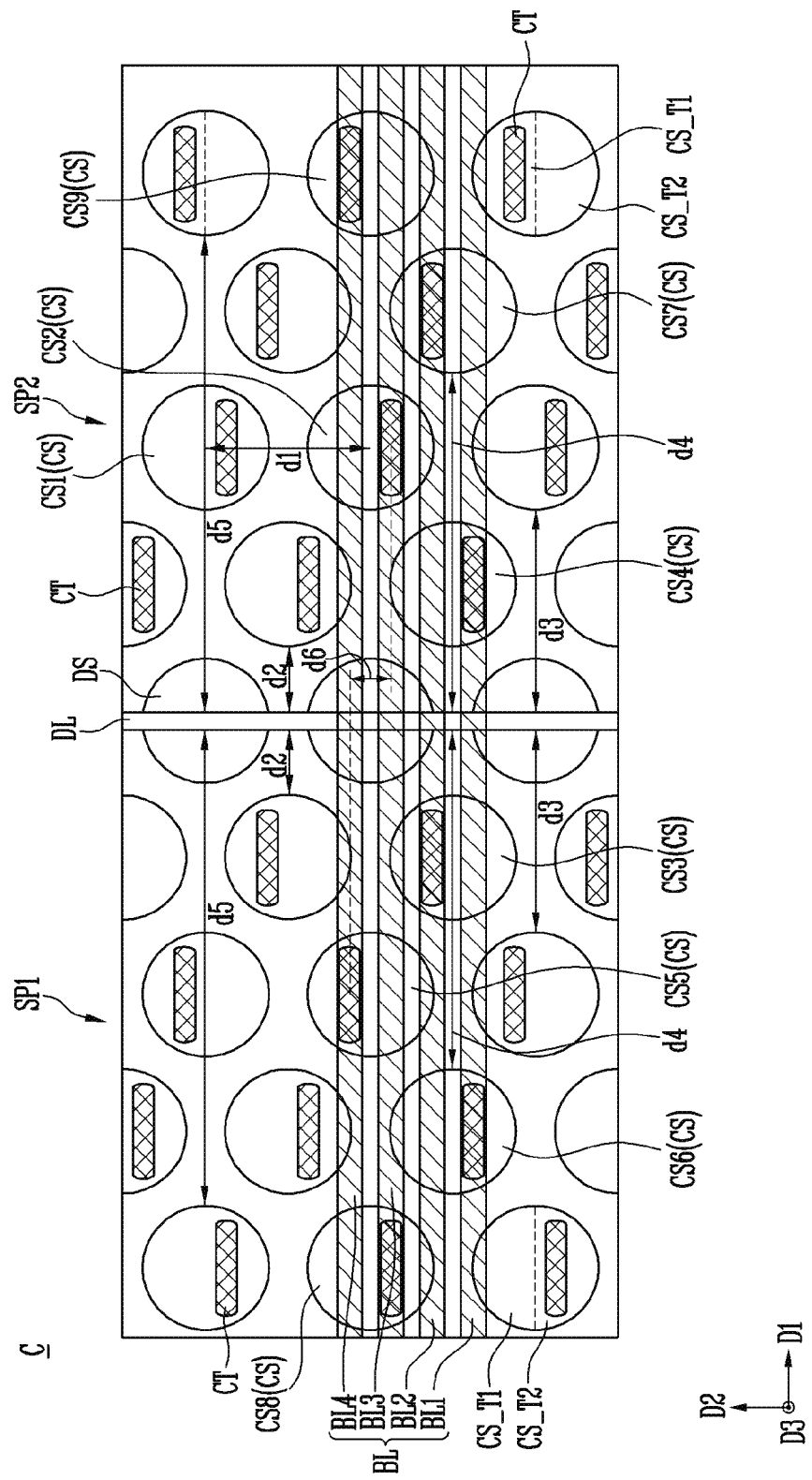
FIG. 1D is an enlarged view of region C shown in FIG. 1A.

FIG. 1A is a plan view of a semiconductor memory device in accordance with an embodiment of the present disclosure. FIG. 1B is a sectional view taken along line A-A' shown in FIG. 1A. FIG. 1C is a sectional view taken along line B-B' shown in FIG. 1A. FIG. 1D is an enlarged view of region C shown in FIG. 1A.

Referring to FIGS. 1A to 1D, the semiconductor memory device in accordance with an embodiment may include a first source layer SL1. The first source layer SL1 may have the shape of a plate extending along a plane defined by a first direction D1 and a second direction D2. The first source layer SL1 may include a conductive material. In an example, the first source layer SL1 may include undoped poly-silicon or P-type doped poly-silicon.

The first source layer SL1 may include first to third isolation regions DR1, DR2, and DR3 and first and second stack regions SR1 and SR2. The first to third isolation regions DR1, DR2, and DR3 may be sequentially arranged along the first direction D1. The second isolation region DR2 may be disposed between the first and third isolation regions DR1 and DR3. The first stack region SR1 may be disposed between the first and second isolation regions DR1 and DR2. The second stack region SR2 may be disposed between the second and third isolation regions DR2 and DR3.

Although not shown in the drawings, a substrate including a peripheral circuit structure and a connection structure may be provided under the first source layer SL1. The substrate may be a single crystalline semiconductor substrate. In an example, the substrate may be a bulk silicon substrate, a silicon on insulator substrate, a germanium substrate, a germanium on insulator substrate, a silicon-germanium substrate, or an epitaxial thin film formed through a selective epitaxial growth process.

The peripheral circuit structure may include NMOS transistors, PMOS transistors, a resistor, and a capacitor. The NMOS transistors, the PMOS transistors, the resistor, and the capacitor may be used as elements constituting a row decoder, a column decoder, a page buffer circuit, and an input/output circuit. The connection structure may include a contact plug and a line.

A second source layer SL2 may be provided on the first source layer SL1. The second source layer SL2 may have the shape of a plate extending along a plane defined by the first direction D1 and the second direction D2. The second source layer SL2 may include a conductive material. In an example, the second source layer SL2 may include N-type doped poly-silicon.

First to third slit structures SS1, SS2, and SS3 may be provided on the first to third isolation regions DR1, DR2, and DR3, respectively. A first stack structure CE1 may be provided on the first stack region SRL A second stack structure CE2 may be provided on the second stack region SR2. The first to third slit structures SS1, SS2, and SS3 may allow the first and second stack structures CE1 and CE2 to be spaced apart from each other. As shown in the drawings, in an embodiment, the first and third slit structures SS1 and SS3 may be slit insulating layers 110, and the second slit structure SS2 may include a common source line CSL and source insulating layers 120. Unlike as shown in the drawings, in an embodiment different from the embodiments shown in FIG. 1B, the first and third slit structures SS1 and SS3 may include a common source line and source insulating layers, and the second slit structure SS2 may be a slit insulating layer.

The first stack structure CE1 may be disposed between the first and second slit structures SS1 and SS2, and the second stack structure CE2 may be disposed between the second and third slit structures SS2 and SS3. The first and second stack structures CE1 and CE2 may be spaced apart from each other in the first direction D1 with the second slit structure SS2 interposed therebetween. In other words, the first and second stack structures CE1 and CE2 may be isolated from each other by the second slit structure SS2.

Each of the first and second stack structures CE1 and CE2 may include insulating patterns IP, conductive patterns CP, and upper insulating patterns UIP. The insulating patterns IP and the conductive patterns CP may be alternately stacked along a third direction D3. The third direction D3 may be a direction vertical to an upper surface of the first source layer SL1. The upper insulating patterns UIP may be provided at an uppermost portion of each of the first and second stack structures CE1 and CE2. In an example, the insulating patterns IP and the upper insulating patterns UIP may include silicon oxide.

The conductive patterns CP may include a gate conductive layer. In an example, the gate conductive layer may include at least one of a doped silicon layer, a metal silicide layer, tungsten, nickel, and cobalt, and be may be used as a word line connected to a memory cell or a select line connected to a select transistor. The conductive patterns CP may further include a gate barrier layer surrounding the gate conductive layer. In an example, the gate barrier layer may include at least one of titanium nitride and tantalum nitride.

Conductive patterns CP located at an uppermost portion among the conductive patterns CP may be defined as first and second select patterns SP1 and SP2. The first and second select patterns SP1 and SP2 may be spaced apart from each other in the first direction D1 with a gate isolation layer DL to be described later, which is interposed therebetween. The gate isolation layer DL may isolate a conductive pattern CP located at the uppermost portion among the conductive patterns CP into the first and second select patterns SP1 and SP2. The first and second select patterns SP1 and SP2 may be used as select lines connected to drain select transistors.

The slit insulating layer 110 may extend in the second direction D2. In an example, the slit insulating layer 110 may include silicon oxide.

The common source line CSL may be disposed between the first and second stack structures CE1 and CE2. The common source line CSL may be electrically connected to the second source layer SL2. The common source line CSL may extend in the second direction D2. The common source line CSL may include a conductive material. In an example, the common source line CSL may include doped poly-silicon or tungsten.

The source insulating layers 120 may be respectively provided between the common source line CSL and the first stack structure CE1 and between the common source line CSL and the second stack structure CE2. The source insulating layers 120 may electrically isolate the common source line CSL and the conductive patterns CP from each other. In an example, the source insulating layers 120 may include silicon oxide.

The gate isolation layer DL may electrically isolate the first and second select patterns SP1 and SP2 of the first stack structure CE1 or the second stack structure CE2 from each other. In an example, the gate isolation layer DL may include silicon oxide. The gate isolation layer DL may extend in the second direction D2. The gate isolation layer DL may extend between the upper insulating patterns UIP. Unlike as shown in the drawings, the gate isolation layer DL may penetrate conductive patterns CP disposed under the first and second select patterns SP1 and SP2.

Conductive patterns CP adjacent to the second source layer SL2 among the conductive patterns CP may be used as select lines connected to source select transistors.

Channel structures CS and dummy structures DS may be provided, which penetrate the first stack structure CE1 and the second stack structure CE2. The channel structures CS and the dummy structures DS may penetrate the second source layer SL2. The channel structures CS and the dummy structures DS may extend in the third direction D3. A lowermost portion of each of the channel structures CS and the dummy structures DS may be provided in the first source layer SL1.

Each of the channel structures CS may include a filling layer FI, a conductive pad PA on the filling layer FI, a channel layer CH surrounding the filling layer FI and the conductive pad PA, and a memory layer ML surrounding the channel layer CH. The filling layer FI and the channel layer CH may penetrate the second source layer SL2. The second source layer SL2 may penetrate the memory layer ML and be in contact with a sidewall of the channel layer CH.

In an example, the filling layer FI may include silicon oxide. In an example, the channel layer CH may include doped poly-silicon or undoped poly-silicon. The memory layer ML may include a tunnel layer in contact with the channel layer CH, a storage layer surrounding the tunnel layer, and a blocking layer surrounding the storage layer. The tunnel layer may include oxide through which charges can tunnel. The storage layer may include a material in which charges can be trapped. The blocking layer may include a material capable of blocking charges.

As shown in the drawings, in an embodiment, the channel layer CH may have the shape of a cylinder. Unlike as shown in the drawings, in an embodiment different from this embodiment, the channel layer CH may have the shape of a circular pillar. The filling layer FI might not be provided in the channel layer CH.

The dummy structures DS may have a structure similar to that of the channel structures. The dummy structures DS may vertically overlap with the gate isolation layer DL.

A first interlayer insulating layer 130 may be provided on the first and second stack structures CE1 and CE2. A second interlayer insulating layer 140 may be provided on the first interlayer insulating layer 130, and a third interlayer insulating layer 150 may be provided on the second interlayer insulating layer 140. In an example, first to third interlayer insulating layers 130, 140, and 150 may include silicon oxide.

Bit lines BL may be provided in the third interlayer insulating layer 150. For convenience of description, only some of the bit lines BL are illustrated in FIGS. 1A to 1D. The bit lines BL may penetrate the third interlayer insulating layer 150. The bit lines BL may extend in the first direction D1. The bit lines BL may be arranged to be spaced apart from each other in the second direction D2. The bit lines BL may be electrically connected to the channel structure CS. The bit line BL may be electrically isolated from the dummy structure DS. The bit lines BL may include a conductive material. In an example, the bit lines BL may include tungsten, aluminum, or copper.

Contacts CT may be provided, which connect the bit lines BL and the channel structures CS. The contacts CT may penetrate the first and second interlayer insulating layers 130 and 140. The contact CT may vertically overlap with a bit line BL corresponding thereto. The channel layer CH and the conductive pad PA may be electrically connected to the bit line BL by the contact CT. The contacts CT may include a conductive material. In an example, the contacts CT may include tungsten, aluminum, or copper.

Hereinafter, a structure of the channel structures CS and the contacts CT will be described with reference to FIG. 1D. A structure of channel structures CS penetrating the first stack structure CE1 and contacts CT on the first stack structure CE1, which will be described hereinbelow, may be similar to that of channel structures CS penetrating the second stack structure CE2 and contacts CT on the second stack structure CE2.

The channel structures CS penetrating the first stack structure CE1 may be regularly arranged in a zigzag form. A pitch in the second direction D2 between the centers of channel structures CS adjacent to each other in the second direction D2 may be defined as a first distance d1. That is, a pitch in the second direction D2 between the centers of two channel structures CS disposed closest to each other in the second direction D2 may be defined as the first distance d1. In an example, a pitch in the second direction D2 between first and second channel structures CS1 and CS2 may be the first distance d1.

One of channel structures CS spaced apart by a second distance d2 from the gate isolation layer DL while penetrating the first select pattern SP1 may be defined as a third channel structure CS3. One of channel structures CS spaced apart by the second distance d2 from the gate isolation layer DL while penetrating the second select pattern SP2 may be defined as a fourth channel structure CS4. The third and fourth channel structures CS3 and CS4 may be disposed symmetrically to each other with respect to the gate isolation layer DL.

One of channel structures CS spaced apart by a third distance d3 from the gate isolation layer DL while penetrating the first select pattern SP1 may be defined as a fifth channel structure CS5. One of channel structures CS spaced apart by the third distance d3 from the gate isolation layer DL while penetrating the second select pattern SP2 may be defined as a second channel structure CS2. The third distance d3 may be greater than the second distance d2. The fifth and second channel structures CS5 and CS2 may be disposed symmetrically to each other with respect to the gate isolation layer DL.

One of channel structures CS spaced apart by a fourth distance d4 from the gate isolation layer DL while penetrating the first select pattern SP1 may be defined as a sixth channel structure CS6. One of channel structures CS spaced apart by the fourth distance d4 from the gate isolation layer DL while penetrating the second select pattern SP2 may be defined as a seventh channel structure CS7. The fourth distance d4 may be greater than the third distance d3. The sixth and seventh channel structures CS6 and CS7 may be disposed symmetrically to each other with respect to the gate isolation layer DL.

One of channel structures CS spaced apart by a fifth distance d5 from the gate isolation layer DL while penetrating the first select pattern SP1 may be defined as an eighth channel structure CS8. One of channel structures CS spaced apart by the fifth distance d5 from the gate isolation layer DL while penetrating the second select pattern SP2 may be defined as a ninth channel structure CS9. The fifth distance d5 may be greater than the fourth distance d4. The eighth and ninth channel structures CS8 and CS9 may be disposed symmetrically to each other with respect to the gate isolation layer DL.

The bit lines BL may include first to fourth bit lines BL1, BL2, BL3, and BL4 sequentially arranged in the second direction D2. The first to fourth bit lines BL1, BL2, BL3, and BL4 may be spaced apart from each other in the second direction D2. The first bit line BL1 and the second bit line BL2 may be adjacent to each other. That is, one of bit lines BL disposed closest to the first bit line BL1 may be the second bit line BL2. The second and third bit lines BL2 and BL3 may be adjacent to each other. The third and fourth bit lines BL3 and BL4 may be adjacent to each other.

The first bit line BL1 may be electrically connected to the sixth channel structure CS6 and the fourth channel structure CS4. The second bit line BL2 may be electrically connected to the third channel structure CS3 and the seventh channel structure CS7. The third bit line BL3 may be electrically connected to the eighth channel structure CS8 and the second channel structure CS2. The fourth bit line BL4 may be electrically connected to the fifth channel structure CS5 and the ninth channel structure CS9. As described above, two channel structures CS disposed symmetrically to each other with respect to the gate isolation layer DL may be respectively connected to different bit lines BL.

The first bit line BL1 may overlap with the third, fourth, sixth, and seventh channel structures CS3, CS4, CS6, and CS7, the second bit line BL2 may overlap with the third, fourth, sixth, and seventh channel structures CS3, CS4, CS6, and CS7, the third bit line BL3 may overlap with the second, fifth, seventh, and ninth channel structures CS2, CS5, CS7, and CS9, and the fourth bit line BL4 may overlap with the second, fifth, seventh, and ninth channel structures CS2, CS5, CS7, and CS9.

An upper surface of each of the channel structures CS may be divided into a first part CS_T1 and a second part CS_T2. The first part CS_T1 and the second part CS_T2 may be divided with respect to a line extending along the first direction D1. The first and second parts CS_T1 and CS_T2 may be symmetrical to each other with respect to the line extending along the first direction D1.

Contacts CT connected to the third, fifth, seventh, and ninth channel structures CS3, CS5, CS7, and CS9 may be respectively connected to the first parts CS_T1 of the third, fifth, seventh, and ninth channel structures CS3, CS5, CS7, and CS9. Contacts CT connected to the first, second, fourth, sixth, and eighth channel structures CS1, CS2, CS4, CS6, and CS8 may be respectively connected to the second parts CS_T2 of the first, second, fourth, sixth, and eighth channel structures CS1, CS2, CS4, CS6, and CS8. As described above, the first part CS_T1 of one of two channel structures CS disposed symmetrically to each other with respect to the gate isolation layer DL is connected to a contact CT, and the second part CS_T2 of the other of the two channel structures CS disposed symmetrically to each other with respect to the gate isolation layer DL is connected to a contact CT.

The centers of contacts CT on two channel structures CS disposed symmetrically to each other with respect to the gate isolation layer DL may be spaced apart by a sixth distance d6 from each other in the second direction D2. In an example, the center of the contact CT of the fifth channel structure CS5 may be spaced apart by the sixth distance d6 from that of the contact CT on the second channel structure CS2 in the second direction D2. The sixth distance d6 may be smaller than the first distance d1. In an example, the sixth distance d6 may be ¼ of the first distance d1. The sixth distance d6 may be equal to a pitch in the second direction D2 between bit lines BL adjacent to each other.

The channel structures CS may constitute a plurality of channel rows. Each of the channel rows may include a plurality of channel structures CS arranged in the second direction D2.

In the semiconductor memory device in accordance with an embodiment, the channel structures CS penetrating the first stack structure CE1 may constitute first to eighth channel rows.

The first channel row and the second channel row may be disposed symmetrically to each other with respect to the gate isolation layer DL, and may be spaced apart by the fifth distance d5 from the gate isolation layer DL in the first direction D1. Accordingly, the eighth channel structure CS8 may be included in the first channel row, and the ninth channel structure CS9 may be included in the second channel row.

The third channel row and the fourth channel row may be disposed symmetrically to each other with respect to the gate isolation layer DL, and may be spaced apart by the fourth distance d4 from the gate isolation layer DL in the first direction D1. Accordingly, the sixth channel structure CS6 may be included in the third channel row, and the seventh channel structure CS7 may be included in the fourth channel row.

The fifth channel row and the sixth channel row may be disposed symmetrically to each other with respect to the gate isolation layer DL, and may be spaced apart by the third distance d3 from the gate isolation layer DL in the first direction D1. Accordingly, the fifth channel structure CS5 may be included in the fifth channel row, and the first channel structure CS1 may be included in the sixth channel row.

The seventh channel row and the eighth channel row may be disposed symmetrically to each other with respect to the gate isolation layer DL, and be spaced apart by the second distance d2 from the gate isolation layer DL in the first direction D1. Accordingly, the third channel structure CS3 may be included in the seventh channel row, and the fourth channel structure CS4 may be included in the eighth channel row.

As described above, the first, third, fifth, and seventh channel rows may be disposed symmetrically to the second, fourth, sixth, and eighth channel rows with respect to the gate isolation layer DL.

Similarly to the first to eighth channel rows, the contacts CT may constitute first to eighth contact rows. The contacts CT of the first contact row may overlap with the second parts CS_T2 of the channel structures CS of the first channel row, and the contacts CT of the second contact row may overlap with the first parts CS_T1 of the channel structures CS of the second channel row. The contacts CT of the third contact row may overlap with the second parts CS_T2 of the channel structures of the third channel row, and the contacts CT of the fourth contact row may overlap with the first parts CS_T1 of the channel structures of the fourth channel row. The contacts CT of the fifth contact row may overlap with the first parts CS_T1 of the channel structures CS of the fifth channel row, and the contacts CT of the sixth contact row may overlap with the second parts CS_T2 of the channel structures CS of the sixth channel row. The contacts CT of the seventh contact row may overlap with the first parts CS_T1 of the channel structures CS of the seventh channel row, and the contacts CT of the eighth contact row may overlap with the second parts CS_T2 of the channel structures CS of the eighth channel row.

According to the above-described arrangement of the channel rows and the contact rows, two bit lines BL adjacent to each other in the second direction D2 may be respectively connected to channel structures CS disposed symmetrically to each other with respect to the gate isolation layer DL. Parasitic capacitances between bit lines BL may be changed depending on the arrangement of contacts CT connected to the bit lines BL. In the semiconductor memory device in accordance with an embodiment, parasitic capacitances of the bit lines BL, which are caused by the contacts CT, can be relatively uniform according to the arrangement of the contacts CT.

Figure 2C:
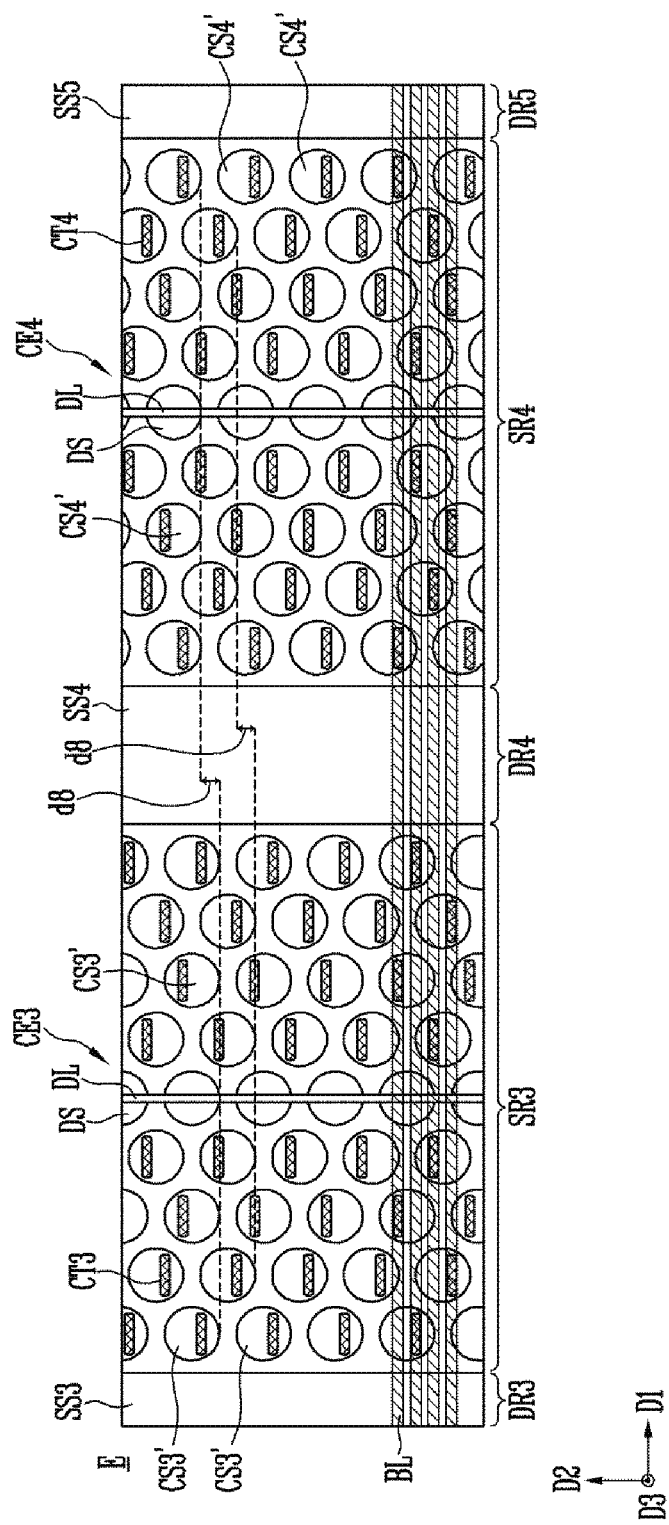
FIG. 2C is an enlarged view of region E shown in FIG. 2A.

FIG. 2A is a plan view of a semiconductor memory device in accordance with an embodiment of the present disclosure. FIG. 2B is an enlarged view of region D shown in FIG. 2A. FIG. 2C is an enlarged view of region E shown in FIG. 2A.

The semiconductor memory device in accordance with an embodiment may be similar to the semiconductor memory devices shown in FIGS. 1A to 1D, except portions described below.

Referring to FIGS. 2A to 2C, a first source layer SL1 of the semiconductor memory device in accordance with an embodiment may include first to fifth isolation regions DR1, DR2, DR3, DR4, and DR5 and first to fourth stack regions SR1, SR2, SR3, and SR4. The first to fifth isolation regions DR1, DR2, DR3, DR4, and DR5 may be sequentially arranged along a first direction D1. The first to fourth stack regions SR1, SR2, SR3, and SR4 may be sequentially arranged along the first direction D1. The first to fifth isolation regions DR1, DR2, DR3, DR4, and DR5 and the first to fourth stack regions SR1, SR2, SR3, and SR4 may be alternately arranged along the first direction D1.

A first stack structure CE1 may be provided on the first stack region SR1, a second stack structure CE2 may be provided on the second stack region SR2, a third stack structure CE3 may be provided on the third stack region SR3, and a fourth stack structure CE4 may be provided on the fourth stack region SR4. First to fifth slit structures SS1, SS2, SS3, SS4, and SS5 may be provided on the first to fifth isolation region DR1, DR2, DR3, DR4, and DR5, respectively. The second to fourth slit structures SS2, SS3, and SS4 may allow the first to fourth stack structures CE1, CE2, CE3, and CE4 to be spaced apart from each other. Some of the first to fifth slit structures SS1, SS2, SS3, SS4, and SS5 may be slit insulating layers, and the others of the first to fifth slit structures SS1, SS2, SS3, SS4, and SS5 may include a common source line and source insulating layers. In an example, the first, third, and fifth slit structures SS1, SS3, and SS5 may be slit insulating layers, and the second and fourth slit structures SS2 and SS4 may include a common source line and source insulating layers.

Channel structures CS penetrating the first stack structure CE1 may be defined as first channel structures CS1, channel structures CS penetrating the second stack structure CE2 may be defined as second channel structures CS2, channel structures CS penetrating the third stack structure CE3 may be defined as third channel structures CS3, and channel structures CS penetrating the fourth stack structure CE4 may be defined as fourth channel structures CS4'.

A pitch in a second direction D2 between the centers of first channel structures CS1' adjacent to each other in the second direction D2 may be defined as a seventh distance d7. A pitch in the second direction D2 between the centers of second channel structures CS2' adjacent to each other in the second direction D2, a pitch in the second direction D2 between the centers of third channel structures CS3' adjacent to each other in the second direction D2, and a pitch in the second direction D2 between fourth channel structures CS4' adjacent to each other in the second direction D2 may be equal to the seventh distance d7.

The first channel structures CS1' and the second channel structures CS2' may be arranged asymmetrically to each other with respect to the second slit structure SS2. The first channel structures CS1' and the second channel structures CS2' may be arranged to cross each other in the second direction D2. The second channel structures CS2' may be shifted by an eighth distance d8 from the first channel structures CS1' in the second direction D2. The eighth distance d8 may be smaller than the seventh distance d7. In an example, the eighth distance d8 may be ¼ of the seventh distance d7. In an example, the eighth distance d8 may be equal to a pitch in the second direction D2 between adjacent bit lines BL.

The third channel structures CS3' may be shifted by the eighth distance d8 from the second channel structures CS2' in the second direction D2, and the fourth channel structures CS4' may be shifted by the eighth distance d8 from the third channel structures CS3' in the second direction D2. Accordingly, the third channel structures CS3' may be shifted by a ninth distance from the first channel structures CS1' in the second direction D2, and the fourth channel structures CS4' may be shifted by a tenth distance from the first channel structures CS1' in the second direction D2. The ninth distance may be twice of the eighth distance d8, and the tenth distance may be three times of the eighth distance d8.

The first channel structures CS1' may constitute first to eighth channel rows, the second channel structures CS2' may constitute first to eighth channel rows, the third channel structures CS3' may constitute first to eighth channel rows, and the fourth channel structures CS4' may constitute first to eighth channel rows.

The first channel structures CS1' may be connected to bit lines BL through first contacts CT1. The first contacts CT1 may constitute first to eighth contact rows. The second channel structures CS2' may be connected to the bit lines BL through second contacts CT2. The second contacts CT2 may constitute first to eighth contact rows. The third channel structures CS3' may be connected to the bit lines BL through third contacts CT3. The third contacts CT3 may constitute first to eighth contact rows. The fourth channel structures CS4' may be connected to the bit lines BL through fourth contacts CT4. The fourth contacts CT4 may constitute first to eighth contact rows.

The second contacts CT2 may be shifted from the first contacts CT1 in the second direction D2. The second contacts CT2 may be disposed asymmetrically to the first contacts CT1 with respect to the second slit structure SS2.

The third contacts CT3 may be shifted from the second contacts CT2 in the second direction D2. The third contacts CT3 may be disposed asymmetrically to the second contacts CT2 with respect to the third slit structure SS3, and be disposed asymmetrically to the first contacts CT1 with respect to the second stack structure CE2.

The fourth contacts CT4 may be shifted from the third contacts CT3 in the second direction D2. The fourth contacts CT4 may be disposed asymmetrically to the third contacts CT3 with respect to the fourth slit structure SS4, be disposed asymmetrically to the first contacts CT1 with respect to the third slit structure SS3, and be disposed asymmetrically to the second contacts CT2 with reference to the third stack structure CE3.

Each of the bit lines BL may be commonly connected to a pair of first channel structures CS1' symmetrical to each other with respect to a gate isolation layer DL among the first channel structures CS1, a pair of second channel structures CS2' symmetrical to each other with respect to the gate isolation layer DL among the second channel structures CS2', a pair of third channel structures CS3' symmetrically to each other with respect to the gate isolation layer DL among the third channel structures CS3', and a pair of fourth channel structures CS4' symmetrically to each other with respect to the gate isolation layer among the fourth channel structures CS4'. According to the above-described arrangement, a pair of first channel structures CS1, a pair of second channel structures CS2', a pair of third channel structures CS3', and a pair of fourth channel structures CS4', which are connected to the same bit line BL, may be included in different channel rows. For example, one of the bit lines BL may be connected to the first channel structures CS1' of the first and second channel rows, the third channel structures CS3' of the third and fourth channel rows, the fourth channel structures CS4' of the fifth and sixth channel rows, and the second channel structures CS2' of the seventh and eighth channel rows.

According to the above-described arrangement, each of the bit lines BL may be connected a pair of first channel structures CS1' spaced apart by an eleventh distance from the gate isolation layer DL, a pair of second channel structures CS2' spaced apart by a twelfth distance from the gate isolation layer DL, a pair of third channel structures CS3' spaced apart by a thirteenth distance from the gate isolation layer, and a pair of fourth channel structures CS4' spaced apart by a fourteenth distance from the gate isolation layer DL. The eleventh to fourteenth distances may be different from one another.

In the semiconductor memory device in accordance with this embodiment, parasitic capacitances of the bit lines BL, which are caused by the contacts CT, can be relatively uniform according to the arrangement of the first to fourth contacts CT1, CT2, CT3, and CT4.

Figure 3B:
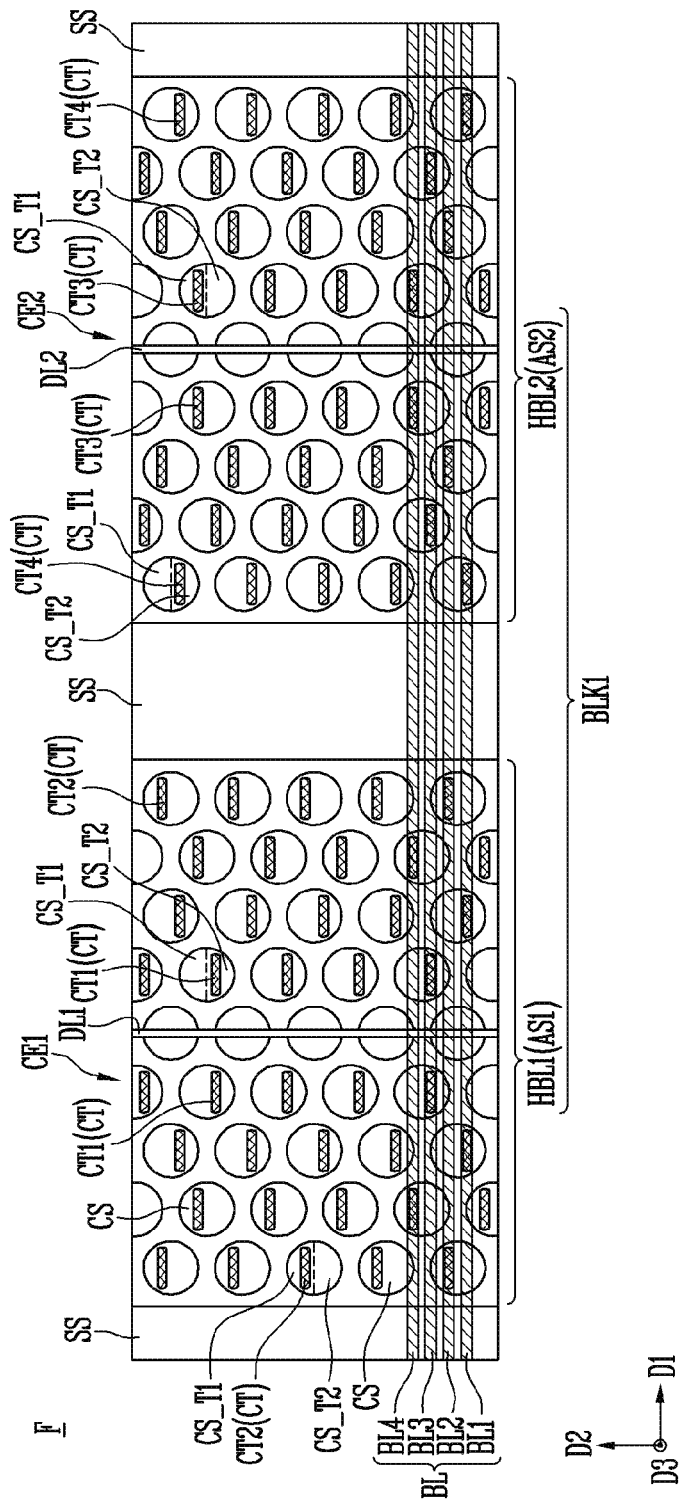
FIG. 3B is an enlarged view of region F shown in FIG. 3A.
Figure 3C:
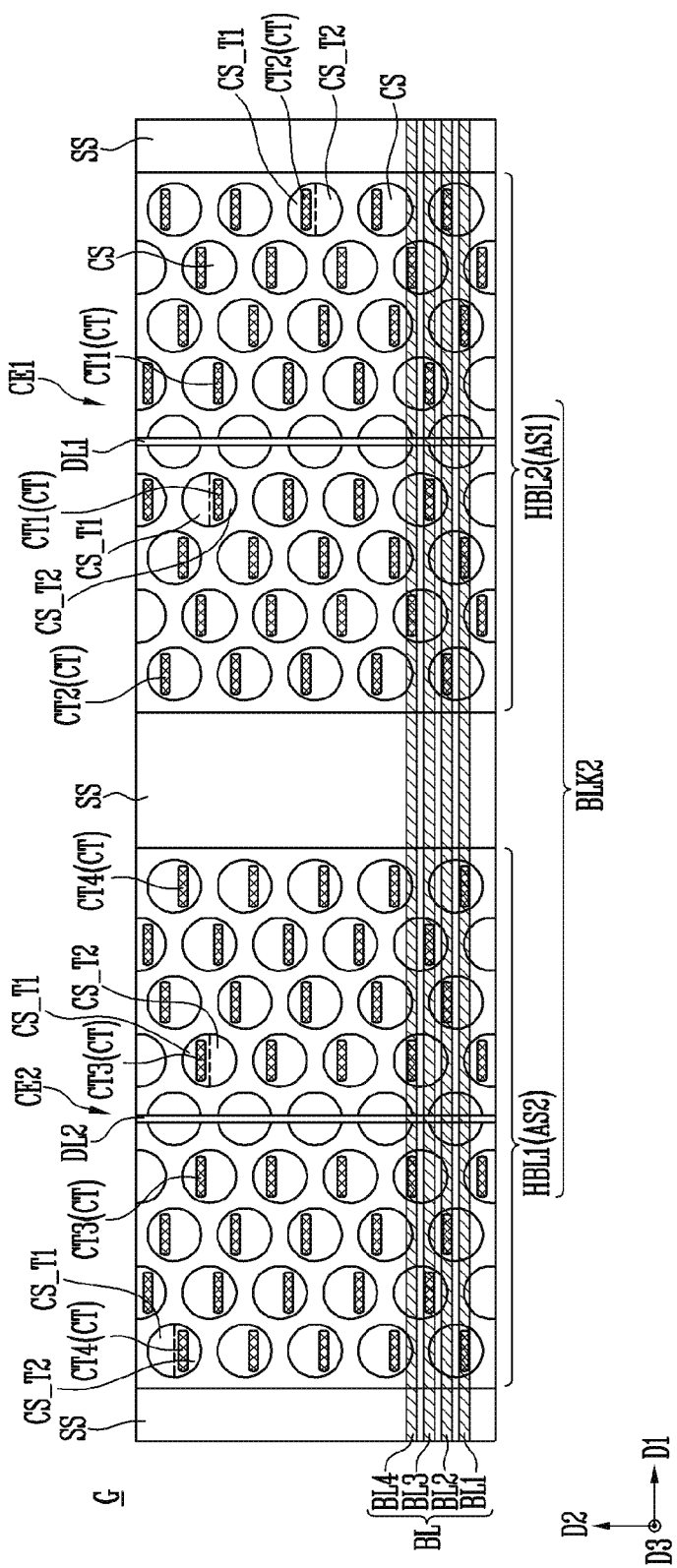
FIG. 3C is an enlarged view of region G shown in FIG. 3A.

FIG. 3A is a schematic plan view of a semiconductor memory device in accordance with an embodiment of the present disclosure. FIG. 3B is an enlarged view of region F shown in FIG. 3A. FIG. 3C is an enlarged view of region G shown in FIG. 3A.

The semiconductor memory devices in accordance with these embodiments may be similar to the semiconductor memory devices shown in FIGS. 1A to 1D, except portions described below.

Referring to FIGS. 3A and 3B, the semiconductor memory devices in accordance with an embodiment may include a plane PL. For example, the semiconductor memory device may include a memory cell array, and the memory cell array may include a plurality of planes. In FIGS. 3A and 3B, any one plane PL among the plurality of planes will be described as an example.

The plane PL may include first to eighth memory blocks BLK1, BLK2, BLK3, BLK4, BLK5, BLK6, BLK7, and BLK8 sequentially arranged along a first direction D1. Each of the first to eighth memory blocks BLK1, BLK2, BLK3, BLK4, BLK5, BLK6, BLK7, and BLK8 may include first and second half blocks HBL1 and HBL2.

The first and second half blocks HBL1 and HBL2 of each of the first to eighth memory blocks BLK1, BLK2, BLK3, BLK4, BLK5, BLK6, BLK7, and BLK8 may have a first contact arrangement structure AS1 or a second contact arrangement structure AS2. In an example, the first half block HBL1 of the first memory block BLK1 may have the first contact arrangement structure AS1, and the second half block HBL2 of the first memory block BLK1 may have the second contact arrangement structure AS2.

Each of half blocks HBL1 and HBL2 having the first contact arrangement structure AS1 may include a first stack structure CE1, channel structures CS penetrating the first stack structure CE1, contacts CT on the channel structures CS, and a first gate isolation layer DL1 penetrating an upper portion of the first stack structure CE1. The first stack structure CE1 may be disposed between slit structures SS.

Each of half blocks HBL1 and HBL2 having the second contact arrangement structure AS2 may include a second stack structure CE2, channel structures CS penetrating the second stack structure CE2, contacts CT on the channel structures CS, and a second gate isolation layer DL2 penetrating an upper portion of the second stack structure CE2. The second stack structure CE2 may be disposed between the slit structures SS.

In each of the first to eighth memory blocks BLK1, BLK2, BLK3, BLK4, BLK5, BLK6, BLK7, and BLK8, the channel structures CS included in the first half block HBL1 and the channel structures CS included in the second half block HBL2 may be disposed symmetrically to each other with respect to the slit structure SS between the first and second half blocks HBL1 and HBL2. The contacts CT included in the first half block HBL1 and the contacts CT included in the second half block HBL2 may be symmetrically to each other with respect to the slit structure SS between the first and second half blocks HBL1 and HBL2.

The contacts CT of the half blocks HBL1 and HBL2 having the first contact arrangement structure AS1 may include first contacts CT1 disposed at the inside of the first stack structure CE1 and second contacts CT2 disposed at the outside of the first stack structure CE1. The first contacts CT1 may be disposed adjacent to the first gate isolation layer DL1. The second contacts CT2 may be disposed adjacent to the slit structure SS. The first contacts CT1 may be connected to a second part CS_T2 of an upper surface of the channel structure CS. The second contacts CT2 may be connected to a first part CS_T1 of the upper surface of the channel structure CS.

The contacts CT of the half blocks HBL1 and HBL2 having the second contact arrangement structure AS2 may include third contacts CT3 disposed at the inside of the second stack structure CE2 and fourth contacts CT4 disposed at the outside of the second stack structure CE2. The third contacts CT3 may be disposed adjacent to the second gate isolation layer DL2. The fourth contacts CT4 may be disposed adjacent to the slit structure SS. The third contacts CT3 may be connected to a first part CS_T1 of an upper surface of the channel structure CS. The fourth contacts CT4 may be connected to a second part CS_T2 of the upper surface of the channel structure CS.

Some of the first contacts CT1 may be connected to a third bit line BL3. Some of the second contacts CT2 may be connected to a second bit line BL2. Some of the third contacts CT3 may be connected to a fourth bit line BL4. Some of the fourth contacts CT4 may be connected to a first bit line BL1.

The first half blocks HBL1 of the first, third, fifth, and seventh memory blocks BLK1, BLK3, BLK5, and BLK7 and the second half blocks HBL2 of the second, fourth, sixth, and eighth memory blocks BLK2, BLK4, BLK6, and BLK8 may have the first contact arrangement structure AS1, and the second half blocks HBL2 of the first, third, fifth, and seventh memory blocks BLK1, BLK3, BLK5, and BLK7 and the first half blocks HBL1 of the second, fourth, sixth, and eighth memory blocks BLK2, BLK4, BLK6, and BLK8 may have the second contact arrangement structure AS2.

In each of the first to eighth memory blocks BLK1, BLK2, BLK3, BLK4, BLK5, BLK6, BLK7, and BLK8, the contacts CT of the first half block HBL1 may constitute first to eighth contact rows, and the contacts CT of the second half block HBL2 may constitute first to eighth contact rows. The contacts CT of the first half block HBL1 and the contacts CT of the second half block HBL2, which are connected to the same bit line BL, may be included in different contact rows. For example, the first bit line BL1 may be connected to the contacts CT of the fifth and sixth contact rows of the first half block HBL1 of the first memory block BLK1 and the contacts CT of the first and second contact rows of the second half block HBL2 of the first memory block BLK1.

In the semiconductor memory device in accordance with this embodiment, each of the memory blocks includes a half block having the first contact arrangement structure AS1 and a half block having the second contact arrangement structure AS2, so that parasitic capacitances of bit lines, which are caused by the contacts in each of the blocks, can be relatively uniform.

FIG. 4 is a schematic plan view of a semiconductor memory device in accordance with an embodiment of the present disclosure.

The semiconductor memory device in accordance with an embodiment may be similar to the semiconductor memory devices shown in FIGS. 3A to 3C, except portions described below.

Referring to FIG. 4, in the semiconductor memory device in accordance with an embodiment, first and second half blocks HBL1 and HBL2 of first, third, fifth, and seventh memory blocks BLK1, BLK3, BLK5, and BLK7 may have a first contact arrangement structure AS1, and first and second half blocks HBL1 and HBL2 of second, fourth, sixth, and eighth memory blocks BLK2, BLK4, BLK6, and BLK8 may have a second contact arrangement structure AS2.

In the semiconductor memory device in accordance with an embodiment, one of a pair of memory blocks adjacent to each other includes half blocks having the first contact arrangement structure AS1, and the other of the pair of memory blocks includes half blocks having the second contact arrangement structure AS2, so that parasitic capacitances of bit lines, which are caused by contacts in a pair of blocks adjacent to each other, can be relatively uniform.

FIG. 5 is a schematic plan view of a semiconductor memory device in accordance with an embodiment of the present disclosure.

The semiconductor memory device in accordance with an embodiment may be similar to the semiconductor memory devices shown in FIGS. 3A to 3C, except portions described below.

Referring to FIG. 5, in the semiconductor memory device in accordance with an embodiment, half blocks HBL1 and HBL2 of first, second, third, and fourth memory blocks BLK1, BLK2, BLK3, and BLK4 may have a first contact arrangement structure AS1, and first and second half blocks HBL1 and HBL2 of fifth, sixth, seventh, and eighth memory blocks BLK5, BLK6, BLK7, and BLK8 may have a second contact arrangement structure AS2.

In the semiconductor memory device in accordance with an embodiment, a plane PL incudes the first to fourth memory blocks BLK1, BLK2, BLK3, and BLK4 having the first contact arrangement structure AS1 and the fifth to eighth memory blocks BLK5, BLK6, BLK7, and BLK8 having the second contact arrangement structure AS2, so that parasitic capacitances of bit lines, which are caused by contacts in the plane PL, can be relatively uniform.

Figure 6:
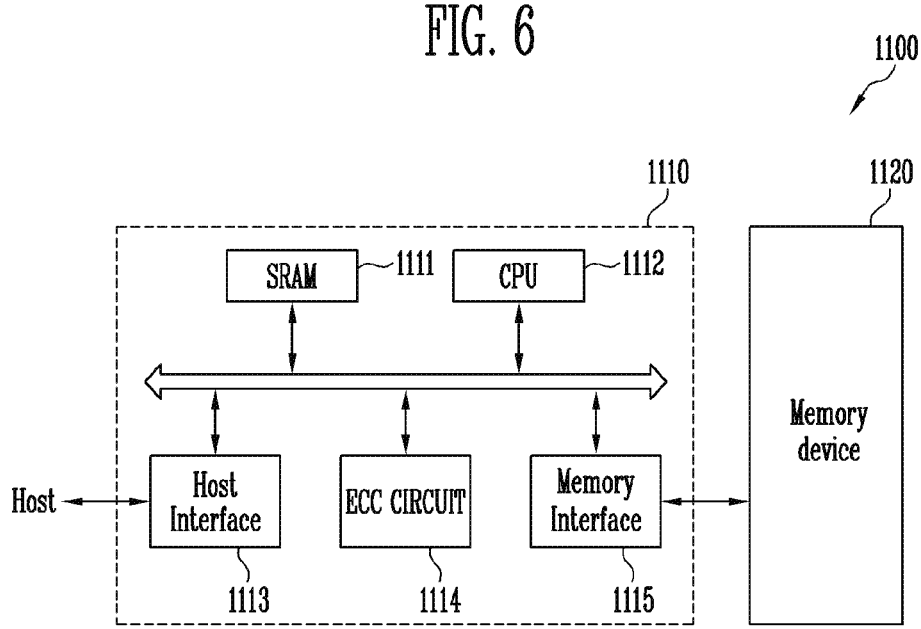
FIG. 6 is a block diagram illustrating a configuration of a memory system in accordance with an embodiment of the present disclosure.

FIG. 6 is a block diagram illustrating a configuration of a memory system in accordance with an embodiment of the present disclosure.

Referring to FIG. 6, the memory system 1100 in accordance with an embodiment of the present disclosure includes a memory device 1120 and a memory controller 1110.

The memory device 1120 may include the structures described with reference to FIGS. 1A to 1D, 2A to 2C, 3A to 3C, 4, or 5. The memory device 1120 may be a multi-chip package configured with a plurality of flash memory chips.

The memory controller 1110 is configured to control the memory device 1120, and may include a Static Random Access Memory (SRAM) 1111, a Central Processing Unit (CPU) 1112, a host interface 1113, an Error Correction Code (ECC) circuit 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The ECC circuit 1114 detects and corrects an error included in a data read from the memory device 1120, and the memory interface 1115 interfaces with the memory device 1120. In addition, the memory controller 1110 may further include an ROM for storing code data for interfacing with the host, and the like.

The memory system 1100 configured as described above may be a memory card or a Solid State Disk (SSD), in which the memory device 1120 is combined with the controller 1110. For example, when the memory system 1100 is an SSD, the memory controller 1100 may communicated with the outside (e.g., the host) through one among various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer Small Interface (SCSI) protocol, an Enhanced Small Disk Interface (ESDI) protocol, and an Integrated Drive Electronics (IDE) protocol.

Figure 7:
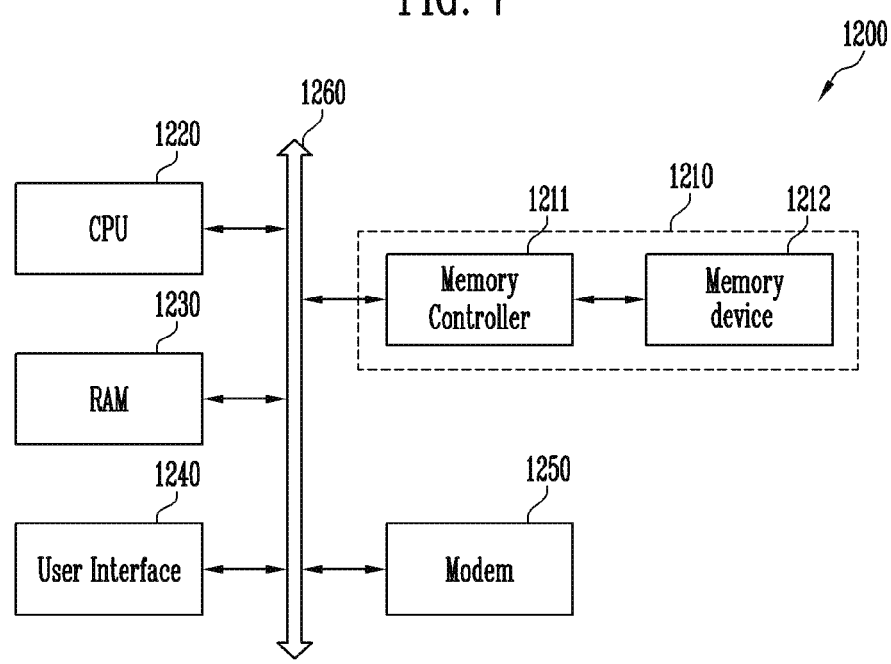
FIG. 7 is a block diagram illustrating a configuration of a computing system in accordance with an embodiment of the present disclosure.

FIG. 7 is a block diagram illustrating a configuration of a computing system in accordance with an embodiment of the present disclosure.

Referring to FIG. 7, the computing system 1200 in accordance with the embodiment of the present disclosure may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a Camera Image Processor (CIS), a mobile D-RAM, and the like may be further included.

The memory system 1200 may be configured with a memory device 1212 and a memory controller 1211 as described with reference to FIG. 6.

In the semiconductor memory device in accordance with the present disclosure, a connection structure between channel structures and bit lines can be designed such that parasitic capacitances between the bit lines can be relatively uniform. Accordingly, the operational reliability of the semiconductor memory device can be improved.

While the present disclosure has been shown and described with reference to certain examples of embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described examples of embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the examples of embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A semiconductor memory device comprising:
   a stacked structure including a first select pattern and a second select pattern, which are spaced apart from each other in a first direction;
   a gate isolation layer extending in a second direction intersecting the first direction between the first select pattern and the second select pattern;
   channel structures penetrating the stack structure;
   first and second bit lines extending in the first direction, the first and second bit lines being adjacent to each other;
   a third bit line adjacent to the second bit line; and
   a fourth bit line adjacent to the third bit line,
   wherein the channel structures include:
   a first channel structure penetrating the first select pattern, the first channel structure being spaced apart by a first distance from the gate isolation layer in the first direction;
   a second channel structure penetrating the second select pattern, the second channel structure being spaced apart by substantially the first distance from the gate isolation layer in the first direction;
   a third channel structure penetrating the first select pattern, the third channel structure being spaced apart by a third distance from the gate isolation layer in the first direction; and
   a fourth channel structure penetrating the second select pattern, the fourth channel structure being spaced apart by the third distance from the gate isolation layer in the first direction,
   wherein the first channel structure is connected to the second bit line,
   the second channel structure is connected to the first bit line,
   the third channel structure is connected to the fourth bit line, and
   the fourth channel structure is connected to the third bit line.

2. The semiconductor memory device of claim 1, further comprising:
   a first contact connecting the first channel structure and the second bit line; and
   a second contact connecting the second channel structure and the first bit line,
   wherein the center of the first contact and the center of the second contact are spaced apart by a second distance from each other in the second direction.

3. The semiconductor memory device of claim 2, wherein the channel structures further include a fifth channel structure adjacent to the first channel structure in the second direction,
   wherein the second distance is substantially ¼ of a pitch in the second direction between the first channel structure and the fifth channel structure.

4. The semiconductor memory device of claim 2, wherein the second distance is substantially equal to a pitch between the first and second bit lines.

5. The semiconductor memory device of claim 1, wherein the first and second channel structures are disposed substantially symmetrically to each other with respect to the gate isolation layer.

6. The semiconductor memory device of claim 1, wherein the channel structures further include:
   a sixth channel structure penetrating the first select pattern, the sixth channel structure being spaced apart by a fourth distance from the gate isolation layer in the first direction; and
   a seventh channel structure penetrating the second select pattern, the seventh channel structure being spaced apart by the fourth distance from the gate isolation layer in the first direction,
   wherein the fourth distance is greater than the third distance,
   wherein the sixth channel structure is connected to the first bit line, and
   the seventh channel structure is connected to the second bit line.

7. The semiconductor memory device of claim 6, wherein the channel structures further include:
   an eighth channel structure penetrating the first select pattern, the eighth channel structure being spaced apart by a fifth distance from the gate isolation layer in the first direction; and
   a ninth channel structure penetrating the second select pattern, the ninth channel structure being spaced apart by the fifth distance from the gate isolation layer in the first direction,
   wherein the fifth distance is greater than the fourth distance, wherein the eighth channel structure is connected to the third bit line, and the ninth channel structure is connected to the fourth bit line.

8. A semiconductor memory device comprising:

first and second stack structures including insulating patterns and conductive patterns;

a first slit structure provided between the first and second stack structures to allow the first and second stack structures to be spaced apart from each other, the first slit structure extending in a first direction;

first channel structures penetrating the first stack structure; and second channel structures penetrating the second stack structure, wherein a pitch in the first direction between the first channel structures is defined as a first distance, wherein the second channel structures are shifted by a second distance from the first channel structures in the first direction, wherein the second distance is smaller than the first distance.

9. The semiconductor memory device of claim 8, wherein the second distance is substantially ¼ of the first distance.

10. The semiconductor memory device of claim 8, further comprising bit lines extending in a second direction intersecting the first direction, wherein a pitch in the first direction between the bit lines is substantially equal to the second distance.

11. The semiconductor memory device of claim 8, further comprising:

a third stack structure including the insulating patterns and the conductive patterns;

a second slit structure provided between the second and third stack structures to allow the second and third stack structures to be spaced apart from each other in a second direction intersecting the first direction, the second slit structure extending in the first direction; and third channel structures penetrating the third stack structure, wherein the third channel structures are shifted by a third distance from the first channel structures in the first direction, wherein the third distance is twice of the second distance.

12. The semiconductor memory device of claim 11, further comprising:

a fourth stack structure including the insulating patterns and the conductive patterns;

a third slit structure provided between the third and fourth stack structures to allow the third and fourth stack structures to be spaced apart from each other in the second direction, the third slit structure extending in the first direction; and fourth channel structures penetrating the fourth stack structure, wherein the fourth channel structures are shifted by a fourth distance from the first channel structures in the first direction, wherein the fourth distance is three times of the second distance.

13. The semiconductor memory device of claim 8, further comprising first contacts overlapping with the first channel structures and second contacts overlapping with the second channel structures, wherein the second contacts are shifted from the first contacts in the first direction.

14. The semiconductor memory device of claim 13, further comprising a bit line extending in a second direction intersecting the first direction, wherein a distance by which one of the first contacts connected to the bit line and the first slit structure are spaced apart from each other is different from that by which one of the second contacts connected to the bit line and the first slit structure are spaced apart from each other.

15. The semiconductor memory device of claim 14, further comprising:

a first gate isolation layer penetrating an upper portion of the first stack structure; and a second gate isolation layer penetrating an upper portion of the second stack structure, wherein the first channel structures are disposed symmetrically to each other with respect to the first gate isolation layer, and the second channel structures are disposed symmetrically to each other with respect to the second gate isolation layer, wherein the first contacts are disposed symmetrically to each other with respect to the first gate isolation layer, and the second contacts are disposed substantially symmetrically to each other with respect to the second gate isolation layer.

16. The semiconductor memory device of claim 15, wherein a distance by which one of the first contacts connected to the bit line and the first gate isolation layer are spaced apart from each other is different from that by which one of the second contacts connected to the bit line and the second gate isolation layer are spaced apart from each other.

17. A semiconductor memory device comprising:

first and second stack structures including insulating patterns and conductive patterns;

a slit structure provided between the first and second stack structures to allow the first and second stack structures to be spaced apart from each other;

first channel structures penetrating the first stack structure;

second channel structures penetrating the second stack structure, the second channel structures being disposed substantially symmetrically to the first channel structures with respect to the slit structure;

third channel structures penetrating the first stack structure;

fourth channel structures penetrating the second stack structure, the fourth channel structures being disposed substantially symmetrically to the third channel structures with respect to the slit structure;

first contacts connected to the first channel structures;

second contacts connected to the second channel structures, which are disposed asymmetrically from the first contacts with respect to the slit structure;

third contacts connected to the third channel structures;

fourth contacts connected to the fourth channel structures, which are disposed asymmetrically from the third contacts with respect to the slit structure; and bit lines connected to the first contacts to the fourth contacts in a one-to-one manner.

18. The semiconductor memory device of claim 17, further comprising:

a first gate isolation layer isolating a conductive pattern located at an uppermost portion among the conductive patterns of the first stack structure into a first select pattern and a second select pattern; and a second gate isolation layer isolating a conductive pattern located at the uppermost portion among the conductive patterns of the second stack structure into a third select pattern and a fourth select pattern, wherein the first channel structures include:

a first channel structure of a first channel row, which penetrates the first select pattern and is spaced apart by a first distance from the first gate isolation layer; and a first channel structure of a second channel row, which penetrates the second select pattern and is disposed symmetrically to the first channel structure of the first channel row with respect to the first gate isolation layer, wherein the second channel structures include:

a second channel structure of a third channel row, which penetrates the third select pattern and is spaced apart by a second distance different from the first distance from the second gate isolation layer; and a second channel structure of a fourth channel row, which penetrates the fourth select pattern and is disposed symmetrically to the second channel structure of the third channel row with respect to the second gate isolation layer, wherein the first contacts include:

a first contact of a first contact row, which is connected to the first channel structure of the first channel row; and a first contact of a second contact row, which is connected to the first channel structure of the second channel row and is disposed symmetrically to the first contact of the first contact row with respect to the first gate isolation layer, wherein the second contacts include:

a second contact of a third contact row, which is connected to the second channel structure of the third channel row; and a second contact of a fourth contact row, which is connected to the second channel structure of the fourth channel row and is disposed symmetrically to the second contact of the third contact row with respect to the second gate isolation layer.

19. The semiconductor memory device of claim 18, wherein the bit lines include a first bit line connected to the first contacts of the first and second contact rows and the second contacts of the third and fourth contact rows.

* * * * *